United States Patent
van Winkelhoff et al.

(10) Patent No.: US 8,493,810 B2
(45) Date of Patent: Jul. 23, 2013

(54) MEMORY CIRCUITRY WITH WRITE BOOST AND WRITE ASSIST

(75) Inventors: Nicolaas Klarinus Johannes van Winkelhoff, Villard-Bonnot (FR); Gerald Jean Louis Gouya, Grenoble (FR); Hsin-Yu Chen, Austin, TX (US)

(73) Assignee: ARM Limited, Cambridge (GB)

( * ) Notice: Subject to any disclaimer, the term of this patent is extended or adjusted under 35 U.S.C. 154(b) by 261 days.

(21) Appl. No.: 13/067,109

(22) Filed: May 9, 2011

(65) Prior Publication Data
US 2012/0287733 A1    Nov. 15, 2012

(51) Int. Cl.
*G11C 7/12*    (2006.01)
(52) U.S. Cl.
USPC ................ 365/230.05; 365/189.04; 711/151
(58) Field of Classification Search
USPC ............ 365/189.04, 189.14, 189.16, 230.05, 365/154; 711/150, 151
See application file for complete search history.

(56) References Cited

U.S. PATENT DOCUMENTS

| | | | |
|---|---|---|---|
| 5,062,081 A * | 10/1991 | Runaldue | 365/230.05 |
| 5,832,304 A * | 11/1998 | Bauman et al. | 710/40 |
| 6,845,059 B1 * | 1/2005 | Wordeman et al. | 365/230.05 |
| 7,251,186 B1 * | 7/2007 | Kengeri et al. | 365/230.05 |
| 7,363,436 B1 * | 4/2008 | Yeh et al. | 711/149 |
| 7,606,108 B2 | 10/2009 | New et al. | |
| 2004/0268061 A1 * | 12/2004 | Khare et al. | 711/151 |

* cited by examiner

*Primary Examiner* — Douglas King
(74) *Attorney, Agent, or Firm* — Nixon & Vanderhye P.C.

(57) ABSTRACT

Memory circuitry 2 includes a memory cell 12 coupled to a plurality of bit line pairs 18, 24 providing multiple access ports. Write boost circuitry 36 serves to increase a write voltage applied to write a data value into the memory cell during at least a boost period of a write access. Collision detection circuitry 10 detects when the write access at least partially overlaps in time with a read access. If a collision is detected, then write assist circuitry serves to drive the bit line pair of the detected read access with a write assist voltage difference having the same polarity as the write voltage and a magnitude less than the write voltage with the boost voltage applied. The write assist circuitry drives the bit line pair of the colliding read independently of the write boost circuitry applying the boost voltage such that the boost voltage is undiminished by the action of the write assist circuitry.

21 Claims, 6 Drawing Sheets

MEMORY CIRCUITRY WITH WRITE BOOST AND WRITE ASSIST

BACKGROUND OF THE INVENTION

1. Field of the Invention

This invention relates to the field of memory circuitry. More particularly, this invention relates to memory circuitry using write boost techniques to increase the voltage difference applied to a memory cell when writing a data value to that memory cell.

2. Description of the Prior Art

It is known to provide memory circuits with a write boost mechanism, such as one utilising capacitive coupling, which serves to increase the voltage difference applied to a memory cell when writing a data value to that memory cell. This increases the reliability of writes to memory cells and accordingly has an advantageous effect upon the yield of memories manufactured.

It is known to provide memories with multiple access ports. Such memories may, for example, provide two access ports with each of these access ports being able to support a read or a write operation independently of the activity upon the other access port. A problem arises when accesses to the same memory location within the memory circuitry overlap in time (at least partially). Two memory accesses which both seek to write to the same memory location and which overlap in time can be identified and suppressed. Overlapping reads to the same memory location do not present a difficulty. However, when a read operation and a write operation overlap in time, then the memory may be configured such that the write operation takes precedence and will cause the read operation to fault or abort. This faulting or aborting of the read operation does not cause too great a difficulty since the read operation may be repeated. In contrast, if a write operation fails, then the data being written may be lost and it may not be possible to recover from the failure.

In order to increase the reliability of multiple port memories it has been proposed in U.S. Pat. No. 7,606,108 that a write assist mechanism may be provided. With this mechanism, when a write is being performed using one of the access ports to a memory, then the same write signal is supplied to the other bit line pairs of the other access ports so as to increase the drive of the voltage difference being applied to the memory cell to write the new data value into the memory cell. This increases the likelihood that the new data value will be successfully written into the memory cell and accordingly increases the reliability of the memory.

SUMMARY OF THE INVENTION

Viewed from one aspect the present invention provides a memory circuitry comprising:

a memory cell;

a plurality of bit line pairs coupled to said memory cell, each of said plurality of bit line pairs providing part of a data access path to said memory cell;

write boost circuitry coupled to a bit line pair of said plurality of bit line pairs and configured apply a boost voltage to a bit line of said bit line pair so as to increase a write voltage difference applied to said memory cell by said bit line pair for a boost portion of a write access so as to assist writing of a bit value to said memory cell;

collision detection circuitry configured to detect a collision when said write access at least partially overlaps in time with a read access to said memory cell via a further bit line pair of said plurality of bit lines; and write assist circuitry coupled to said further bit line pair and said collision detection circuitry and configured to respond to detection of said collision to drive a write assist voltage difference applied to said memory cell by bit lines of said further bit line pair with a polarity matching said write voltage difference and a magnitude less than said write voltage difference with said boost voltage applied, said write assist circuitry driving of said further bit line pair independently of said write boost circuitry applying said boost voltage to said bit line pair such that said boost voltage is undiminished by action of said write assist circuitry.

The present techniques recognise that when a write boost mechanism is provided in combination with a write assist mechanism, then simply applying the boosted write voltage signal being used at the bit line pair via which the write is being made to also drive the further bit lines to which the write assist voltage is being applied may disadvantageously reduce the magnitude of the boost voltage thereby reducing the reliability of the memory. In particular, if a read of a data value opposite the data value to be written into the memory cell has previously been initiated from the other port, then one of the bit lines of that other port may be fully discharged in the opposite sense to that required of the bit lines of the port through which the write is being made in order to make that write. A consequence of this is that the boost voltage circuitry would be required to produce a large voltage swing on the discharged further bit line in a way which reduces the magnitude of the boost voltage achieved such that this is less effective in increasing the likelihood that the data value will be written into the memory cell. In order to address this problem, the present technique proposes that the write assist voltage difference is driven with the same polarity as the write voltage difference but independently from the write boost circuitry which applies the boost voltage to the bit line pair via which the write is being made such that the boost voltage is undiminished (unchanged or unaffected) by the action of the write assist circuitry. This helps to ensure that the write boost circuitry maintains its effectiveness in ensuring that the bit value is correctly written into the memory cell whilst allowing the write assist circuitry to suppress any negative impact of the further bit lines as a consequence of an earlier and overlapping read having voltage potentials which would otherwise resist the change of bit value to be made in the memory cell.

The memory circuitry may be provided with power supply conductors which provide a VDD voltage and a ground voltage the memory circuitry. These voltages may, for example, have potential such as 1.0V and 0V respectively and the boost voltage may be of the order of −0.2V.

The action of the boost voltage is to increase the write voltage difference to greater than the voltage difference between the VDD voltage and the ground voltage. This increased voltage difference has the effect that the memory cell is more likely to switch its state if this is required by the new data value being written to that memory cell.

The boost voltage circuitry may provide a voltage level to one of the bit line pair to take this to a potential that is below the ground voltage during at least the boost portion of the write access. Capacitive coupling may be used to achieve this lower than ground voltage for a temporary period with the relevant bit line being floated at this lower than ground voltage for the boost portion of the write access.

As the write assist voltage difference is driven without use of the boost circuitry, the write assist voltage difference will typically be less than the voltage difference between the VDD voltage and the ground voltage. The write assist voltage difference is not primarily acting itself to write the data value into the memory cell, but is rather being controlled by the write assist circuitry such that the voltages on the further bit line pairs do not impede the writing of the bit value which is desired.

The memory circuitry may derive the write voltage difference from a plurality of buffered signals generated by buffer circuits responsive to the write data signal.

In order to improve the signal noise immunity of the memory circuitry, in some embodiments additional buffer circuitry may be used to generate additional buffered signals with these additional buffered signals being used to drive the further bit line pairs with other separately generated buffered signals are used to control the write voltage difference.

Viewed from another aspect the present invention provides a memory circuitry comprising:

memory cell means for storing a bit value;

a plurality of bit line pair means for providing part of data access paths to said memory cell means;

write boost means for applying a boost voltage to a bit line of a bit line pair means of said plurality of bit line pair means so as to increase a write voltage difference applied to said memory cell means by said bit line pair means for a boost portion of a write access so as to assist writing of said bit value to said memory cell means;

collision detection means for detecting a collision when said write access at least partially overlaps in time with a read access to said memory cell means via a further bit line pair means of said plurality of bit line means; and write assist means for responding to detection of said collision by driving a write assist voltage difference applied to said memory cell means by bit lines of said further bit line pair means with a polarity matching said write voltage difference and a magnitude less than said write voltage difference with said boost voltage applied, said write assist means driving of said further bit line pair means independently of said write boost means applying said boost voltage to said bit line pair means such that said boost voltage is undiminished by action of said write assist means.

Viewed from a further aspect the present invention provides a method of operating memory circuitry comprising the steps of:

storing a bit value with a memory cell;

providing part of data access paths to said memory cell via a plurality of bit line pairs;

applying a boost voltage to a bit line of a bit line pair of said plurality of bit line pairs so as to increase a write voltage difference applied to said memory cell by said bit line pair for a boost portion of a write access so as to assist writing of said bit value to said memory cell;

detecting a collision when said write access at least partially overlaps in time with a read access to said memory cell via a further bit line pair of said plurality of bit lines; and responding to detection of said collision by driving a write assist voltage difference applied to said memory cell by bit lines of said further bit line pair with a polarity matching said write voltage difference and a magnitude less than said write voltage difference with said boost voltage applied, driving of said further bit line pair being independent of applying said boost voltage to said bit line pair such that said boost voltage is undiminished by action of said write assist means.

The above, and other objects, features and advantages of this invention will be apparent from the following detailed description of illustrative embodiments which is to be read in connection with the accompanying drawings.

DESCRIPTION OF THE EMBODIMENTS

Figure 1:
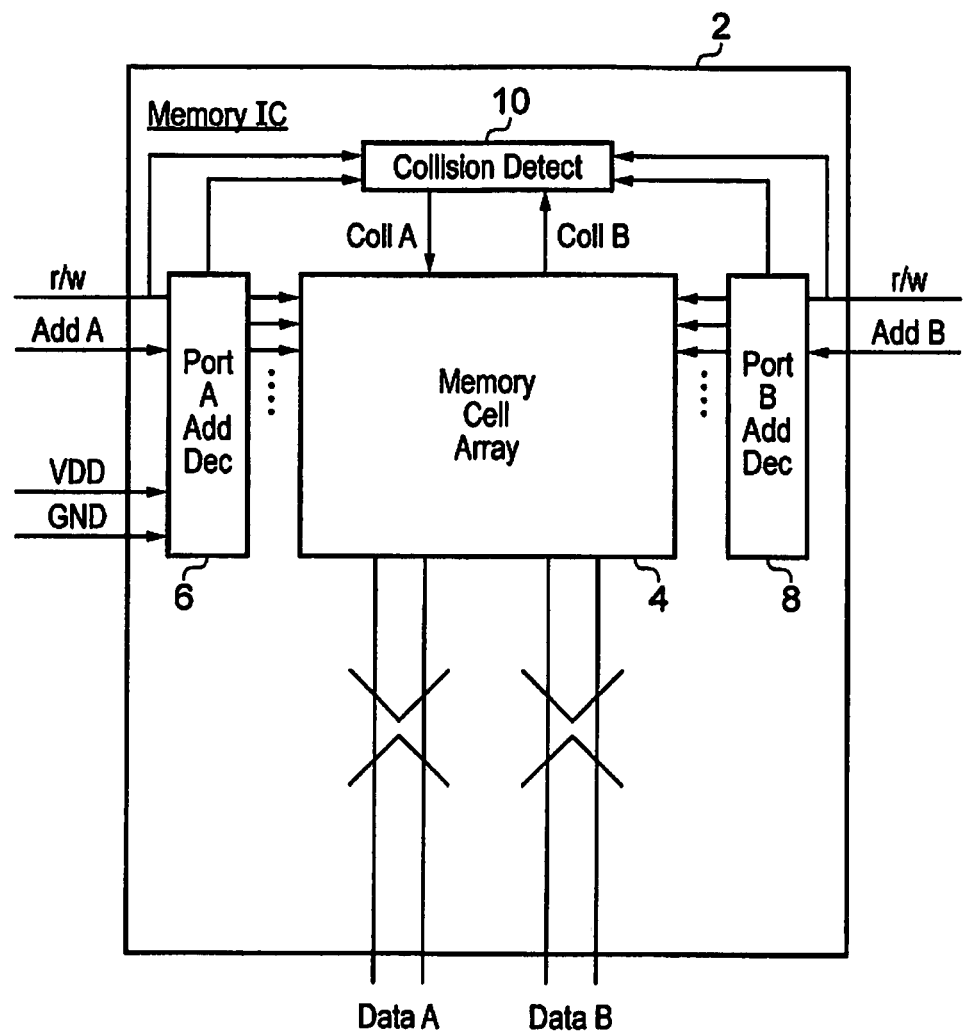
FIG. 1 schematically illustrates memory circuitry in the form of an integrated circuit having two data access ports.

FIG. 1 schematically illustrates memory circuitry 2 having two data access ports A, B. The present techniques may also be used with memory circuitry having more than two memory access ports. The memory circuitry 2 includes an array of memory cells 4. This array of memory cells comprises a plurality of individual memory cells, such as six transistor (6T) memory cells as will be familiar to those in this technical field. Bit line pairs run through the array of memory cells 4 to provide data access to the memory cells in the form of either read operations or write operations. Separate bit line pairs are provided for port A and port B. Thus, each memory cell will be connected to a bit line pair for port A as well as a bit line pair for port B. Word lines for these respective ports A, B control whether or not the memory cell is coupled to the corresponding bit line pair.

Memory address decoders 6, 8 are responsive to memory addresses asserted on either port A or port B to assert an access signal on the appropriate word line. An r/w signal received at each port controls whether or not the data access at that port is a read or a write. Power rails provide a VDD supply voltage and a ground voltage to the memory circuitry 2. These power signals are distributed through the memory circuitry 2 in order to power the memory cells themselves as well as the various decoders and other support circuitry.

Collision detection circuitry 10 is responsive to the addresses asserted at each of the ports A, B as well as the signals r/w indicating whether those ports are performing a read or a write operation. If the collision detection circuitry detects that a write is performed at port A which overlaps at least partially in time with a read being performed via port B, then a collision is detected on port A. This collision serves to force the bit lines for port B to write assist voltage levels whilst permitting the write upon port A to proceed normally. The read on port B will accordingly fail and may need to be performed again at a later time. In a similar way, if the collision detection circuitry detects that a write performed via port B at least partially overlaps in time with a read being performed via port A, then a collision on port B is detected and complementary action to that described above is taken.

Figure 2:
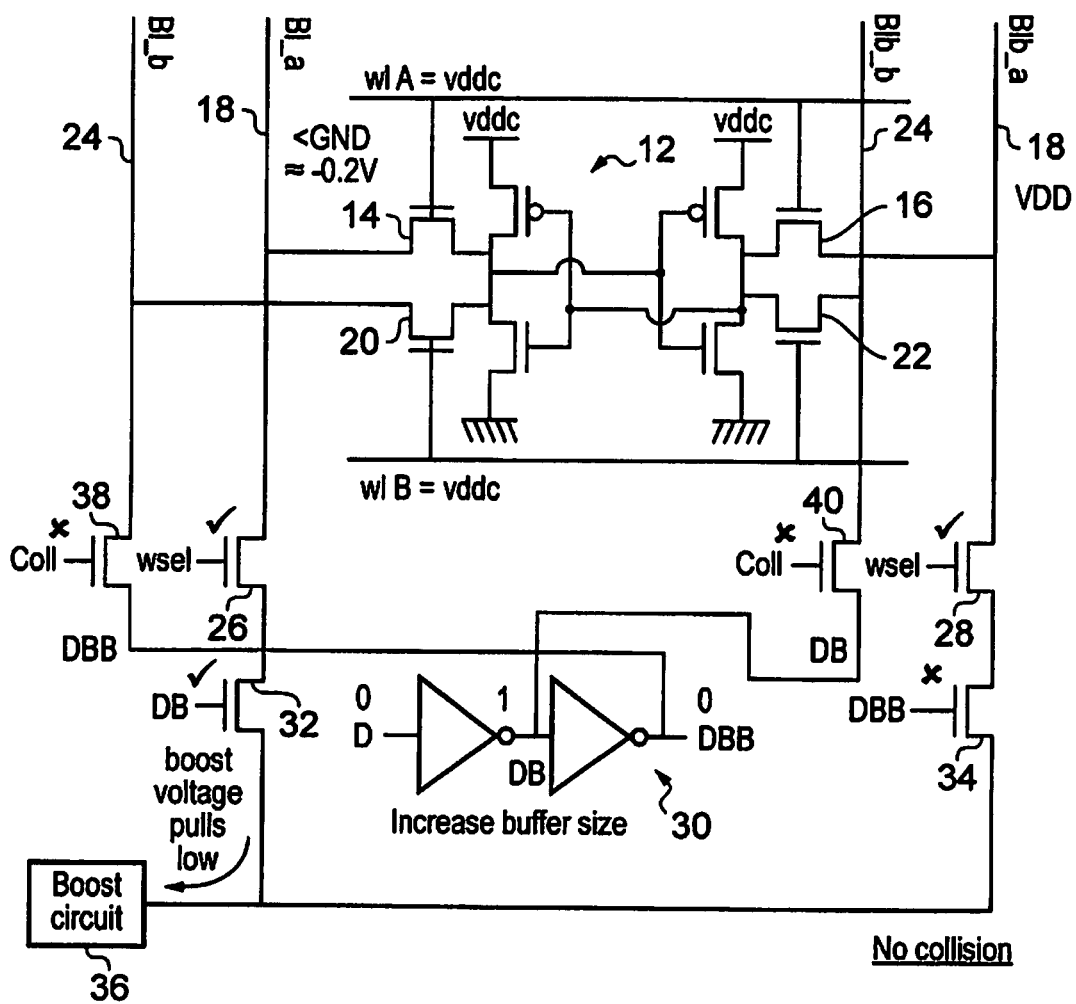
FIG. 2 schematically illustrates memory circuitry in accordance with a first example embodiment operating when no collision occurs.

FIG. 2 schematically illustrates a portion of the memory circuitry 2 when no collision occurs. A memory cell 12 is formed by two cross-coupled inverters in the normal way. Word line transistors 14, 16 control coupling of the memory cell 12 to the bit line pair 18 when a memory access via port A is required. Word line transistors 20, 22 control coupling of the memory cell 12 to a further bit line pair 24 when a data access via port B is required.

FIG. 2 schematically illustrates the write boost circuitry and the write assist circuitry which operates when a write is made via port A that collides with a read being made on port B. It will be appreciated that complementary circuitry (i.e. the same circuitry but swapped in relation to which of the ports it is connected) is be provided to deal with a write being made to port B which collides with a read being made at port A. This complementary circuitry is not illustrated in FIG. 2 for the sake of clarity.

Write select transistors 26, 28 are controlled by a write select signal wsel to conduct when a write is being performed via port A using the bit line pair 18. Buffer circuitry 30 is responsive to a write signal D corresponding to the bit value to be written into the memory cell 12 and serves to form buffered signals DB, DBB. These buffered signals DB and DBB respective control write voltage transistors 32, 34 to couple the appropriate one of the bit line pair 18 to ground so as to write the desired data value in the memory cell 12. In the example illustrated, a value of "0" is being written into the memory cell 12 and this is achieved by pulling the potential of the bit line attached to the write voltage transistor 32 low while the bit line attached to the write voltage transistor 34 remains at its high (precharged) level.

Write boost circuitry 36 serves to pull the bit line connected to the write voltage transistor 32 to a lower level than the ground voltage GND during a boost period by applying a boost voltage, e.g. the boost voltage may pull the voltage level down to approximately −0.2V in a system nominally operating with a VDD level of 1.0V. The write boost circuitry 36 may use capacitive coupling techniques to generate this boost voltage to pull the potential of the bit line connected to the write voltage transistor 32 to a lower floating level. The difficulty of generating this boost voltage with a sufficient drive strength to pull further bit lines to a low voltage is such that this approach would reduce the magnitude of the boost voltage which could be achieved and thus reduce the effectiveness of the write boost technique. Increasing the physical size of the write boost circuitry 36 to increase its drive strength would be one option, but this would impose a disadvantageous increase in circuit size, power consumption etc, in order to deal with collision situations which only rarely occur.

In order that the potential levels on the bit line pair 24 do not impede the data value being written into the memory cell 12 via port A, write assist circuitry in the form of collision transistors 38, 40 and signals derived from the buffer circuitry 30 is used to drive the bit lines 24. In the example shown in FIG. 2, no collision has occurred and accordingly the collision transistors 38, 40 are not conductive.

Figure 3:
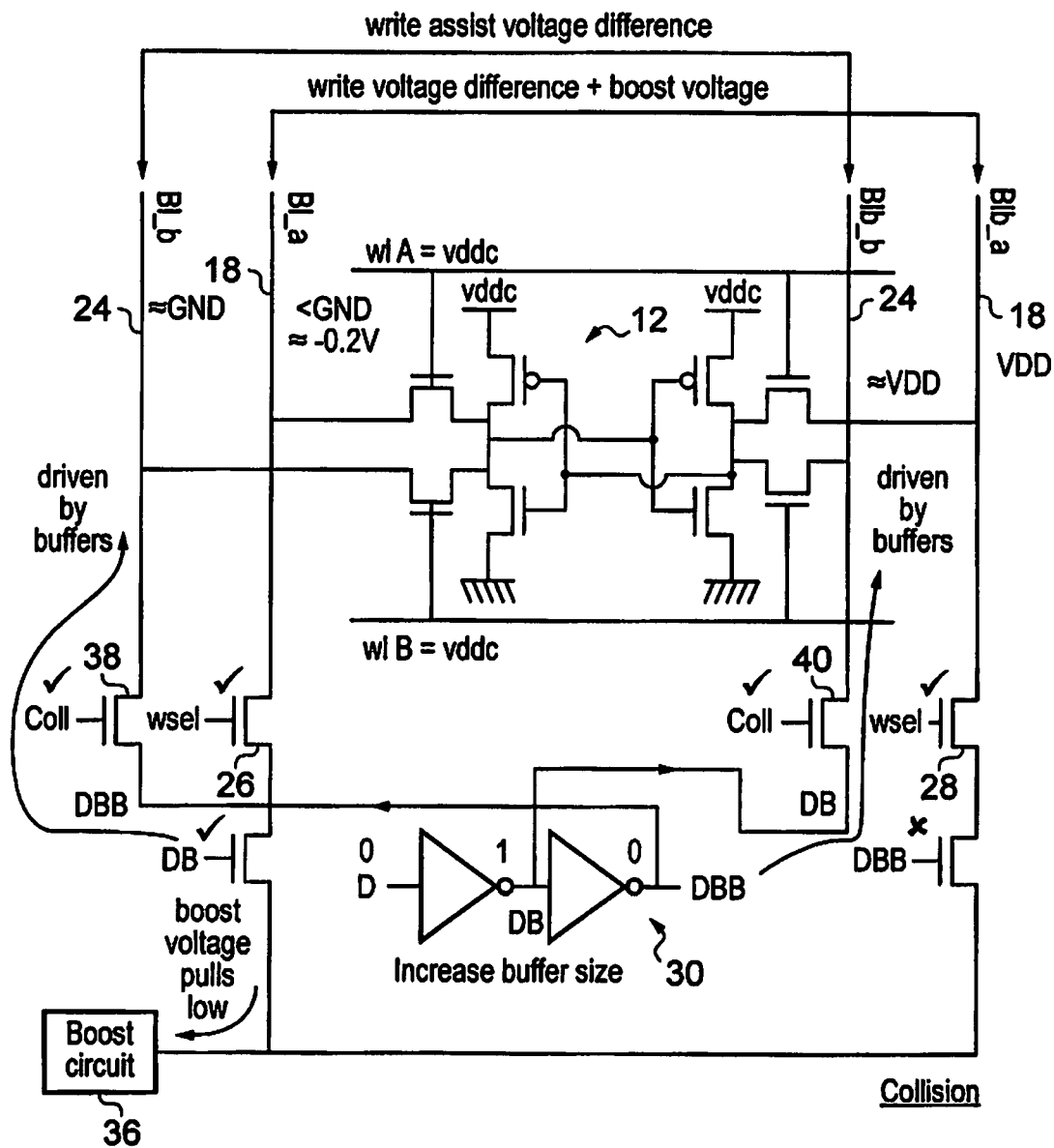
FIG. 3 schematically illustrates memory circuitry in accordance with the first example embodiment operating when a collision occurs.

FIG. 3 illustrates the circuit of FIG. 2 operating to write a value of "0" into the memory cell 12. In this case a collision has occurred and the write via port A at least partially overlaps in time with a read being performed via port B. The collision detection circuitry 10 asserts a collision signal Coll which switches on the collision transistors 38, 40. In this way, the buffered signal DB is supplied via collision transistor 40 to one of the bit line pair 24 while the other buffered signal DBB is supplied via collision transistor 38 to the other bit line of the bit line pair 24. The write assist voltage thus applied to the bit line pair 24 has the same polarity as the write voltage applied to the bit line pair 18. However, the magnitude of the write assist voltage is lower than the magnitude of the write voltage with the boost voltage applied during the boost period. The write assist voltage is driven by the buffer circuitry 30 and is not driven by the write boost circuitry 36. This has the result that small and efficient write boost circuitry 36 may still be used and yet when a collision occurs, the bit line pair 24 are driven in the correct sense by the buffer circuitry 30 so as not to impede the writing of the data value desired. The write voltage with the boost voltage is not diminished by the action of the write assist circuitry, e.g. the switching on of the collision transistors 38, 40 when a collision occurs.

Figure 4:
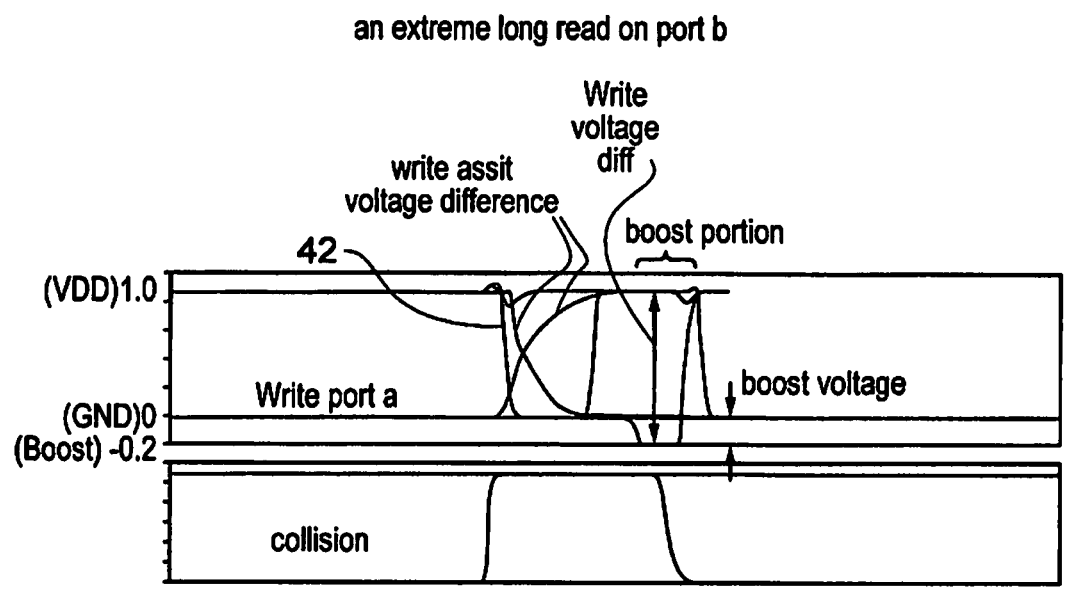
FIG. 4 schematically illustrates variation of signal levels with time during the operation illustrated in FIG. 3.

FIG. 4 is a signal diagram illustrating the voltage level of a number of the signals in the operation of the memory circuitry of FIG. 3. Signal 42 is the write voltage on the bit line connected to word line transistor 26. This write voltage is pulled to a low voltage level when writing a "0" into the memory cell 12. As will be seen, the write voltage level is rapidly drawn low to a ground voltage level and then during a boost portion of the write operation is drawn to a lower negative voltage level by the application of the boost voltage produced by the write boost circuitry 36.

The write assist voltage difference illustrated in FIG. 4 is the voltage difference between the bit lines 24. These bit lines 24 in this example have previously been subject to a long read operation which has completely discharged the bit line coupled to the collision transistor 40 while the bit line coupled to collision transistor 38 remains fully precharged. These voltage levels if not modified by the write assist voltage would serve to oppose the bit value which it is desired to write into the bit cell 12. Accordingly, the write assist voltage difference applied changes these voltage levels by application of DB and DBB signals generated by the buffer circuitry 30 and applied via the collision transistors 38, 40. It is not required that these potentials of the bit line pair 24 rapidly reach the full rail voltages that match the write, rather that they should be moved away from the full rail values which oppose the write to be performed.

The write voltage difference illustrated in FIG. 4 will be seen to exceed in magnitude the write assist voltage difference during at least the boost portion of the write access.

Figure 5:
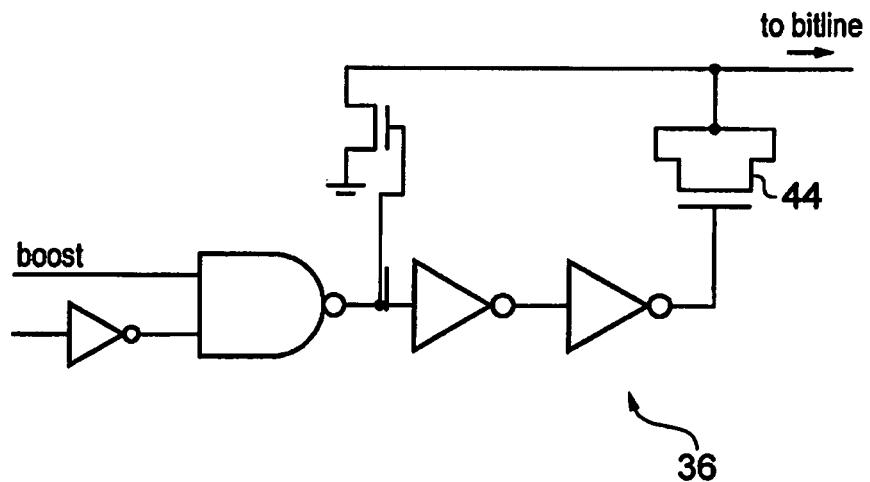
FIG. 5 schematically illustrates boost voltage circuitry.

FIG. 5 schematically illustrates write boost circuitry 36 including a capacitative element 44 in the form of a transistor with its source and drain coupled together. The action of such write boost circuitry 36 in generating a boost voltage to pull a bit line voltage lower will be familiar to those in this technical field.

It will be appreciated that in other embodiments the boost voltage could be applied to instead drive the VDD voltage level higher for a boost period.

Figure 6:
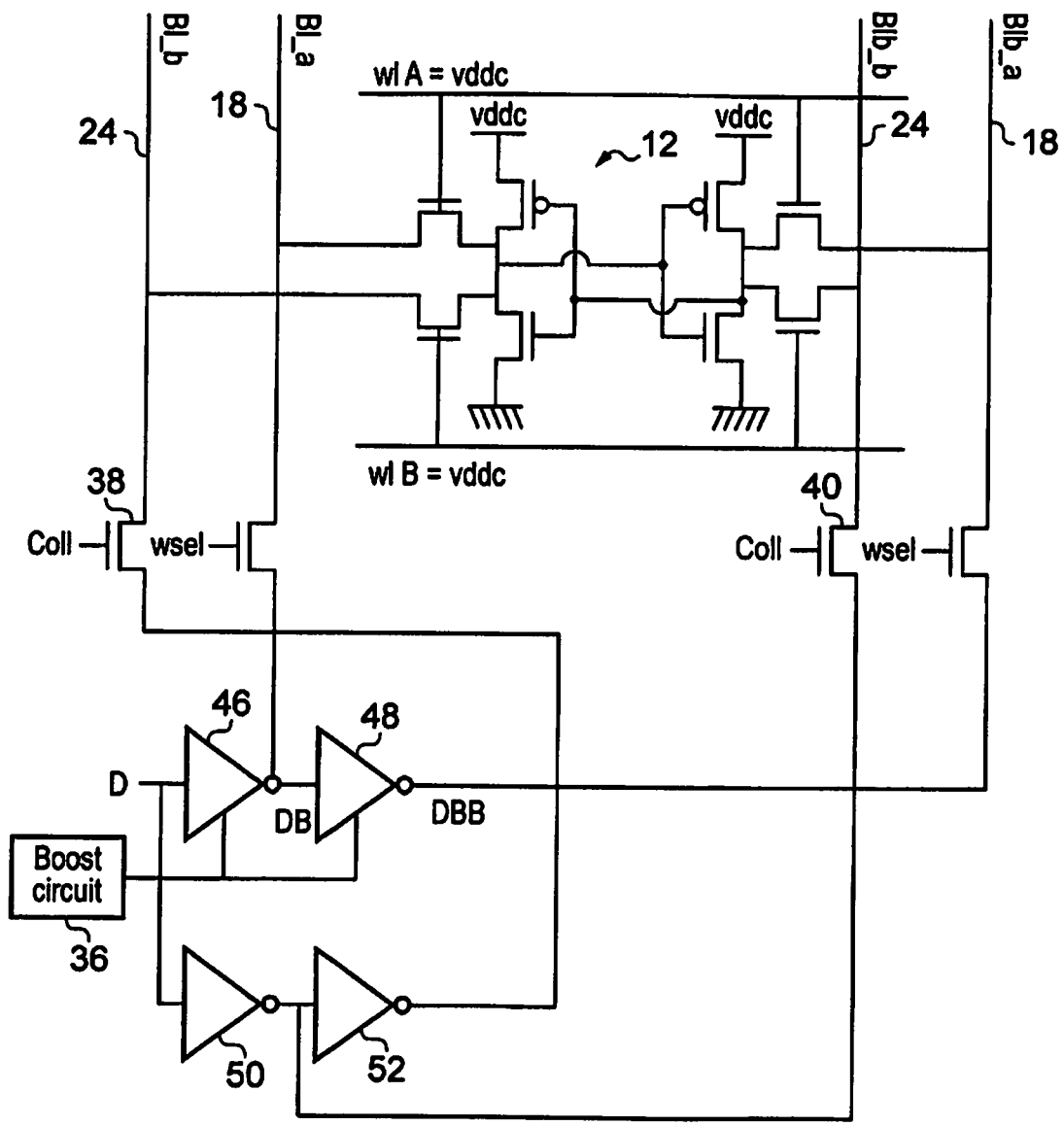
FIG. 6 schematically illustrates memory circuitry in accordance with a second example embodiment.

FIG. 6 illustrates a second example embodiment. The write boost circuitry 36 includes inverters 46, 48 which generate the write voltage difference that is applied to the bit line pair 18. Further buffer circuitry in the form of inverters 50, 52 serves to generate the write, assist voltages which are applied via the collision transistors 38, 40 when a collision is detected. The use of separate inverters to generate the write voltage from those used to generate the write assist voltage has the advantage of improving the noise immunity of the memory circuitry.

Figure 7:
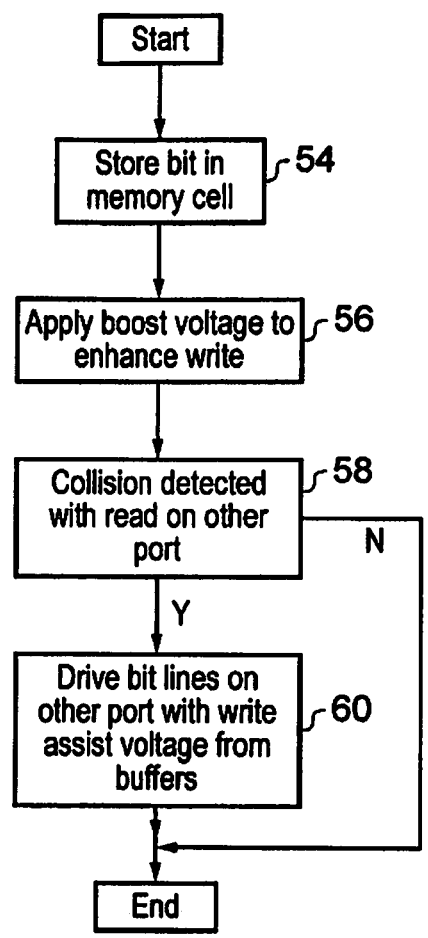
FIG. 7 is a flow diagram schematically illustrating the operation of the circuitry in FIGS. 2 and 3.

FIG. 7 is a flow diagram schematically illustrating the operation of the circuitry shown in FIGS. 2 and 3. At step 54, a bit value is stored into the memory cell 12 by application of the write voltage. At step 56, the boost voltage is applied for a boost period in order to enhance the write operation. At step 58, the collision detection circuitry 10 serves to detect whether there is a read on the other port to that upon which the write is being performed. If there is no such other read, then the processing terminates. If the determination at step 58 is that such another read present and is at least partially overlapping in time, then step 60 serves to drive the bit lines of that other port with a write assist voltage derived from separate from the boost voltage. This write assist voltage has the same polarity as the write voltage, but has a lower magnitude than the write voltage with the boost voltage applied.

It will be appreciated that in practice, the sequential steps of FIG. 7 will typically be performed in parallel by hardware elements and may in fact be performed in a different order.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. Memory circuitry comprising:
   a memory cell;
   a plurality of bit line pairs coupled to said memory cell, each of said plurality of bit line pairs providing part of a data access path to said memory cell;
   write boost circuitry coupled to a bit line pair of said plurality of bit line pairs and configured apply a boost voltage to a bit line of said bit line pair so as to increase a write voltage difference applied to said memory cell by said bit line pair for a boost portion of a write access so as to assist writing of a bit value to said memory cell;
   collision detection circuitry configured to detect a collision when said write access at least partially overlaps in time with a read access to said memory cell via a further bit line pair of said plurality of bit lines; and
   write assist circuitry coupled to said further bit line pair and said collision detection circuitry and configured to respond to detection of said collision to drive a write assist voltage difference applied to said memory cell by bit lines of said further bit line pair with a polarity matching said write voltage difference and a magnitude less than said write voltage difference with said boost voltage applied, said write assist circuitry driving of said further bit line pair independently of said write boost circuitry applying said boost voltage to said bit line pair such that said boost voltage is undiminished by action of said write assist circuitry.

2. Memory circuitry as claimed in claim 1, comprising power supply conductors configured to provide a VDD voltage and a ground voltage to said memory circuitry.

3. Memory circuitry as claimed in claim 2, wherein said boost voltage increases said write voltage difference to greater than a voltage difference between said VDD voltage and said ground voltage.

4. Memory circuitry as claimed in claim 3, wherein said boost voltage circuitry provides a voltage level to one of said bit line pair that is below said ground voltage during at least said boost portion of said write access.

5. Memory circuitry as claimed in claim 2, wherein said write assist voltage difference is less than a voltage difference between said VDD voltage and said ground voltage.

6. Memory circuitry as claimed in claim 1, wherein said bit value is determined by a write data signal and said write assist circuitry comprise a plurality of buffer circuits configured to generate a plurality buffered signals in dependence upon said write data signal.

7. Memory circuitry as claimed in claim 6, wherein said plurality buffered signals control generation of said write voltage difference without said boost voltage.

8. Memory circuitry as claimed in claim 6, wherein said plurality of buffered signals drive said further bit line pair to provide said write assist voltage difference.

9. Memory circuitry as claimed in claim 6, comprising one or more additional buffer circuits configured to generate a plurality of additional buffered signals, wherein said plurality of additional buffered signals drive said further bit line pair to provide said write assist voltage difference.

10. Memory circuitry as claimed in claim 1, comprising an array of memory cells, said memory cell being part of said array of memory cells.

11. Memory circuitry comprising:
    memory cell means for storing a bit value;
    a plurality of bit line pair means for providing part of data access paths to said memory cell means;
    write boost means for applying a boost voltage to a bit line of a bit line pair means of said plurality of bit line pair means so as to increase a write voltage difference applied to said memory cell means by said bit line pair means for a boost portion of a write access so as to assist writing of said bit value to said memory cell means;
    collision detection means for detecting a collision when said write access at least partially overlaps in time with a read access to said memory cell means via a further bit line pair means of said plurality of bit line means; and
    write assist means for responding to detection of said collision by driving a write assist voltage difference applied to said memory cell means by bit lines of said further bit line pair means with a polarity matching said write voltage difference and a magnitude less than said write voltage difference with said boost voltage applied, said write assist means driving of said further bit line pair means independently of said write boost means applying said boost voltage to said bit line pair means such that said boost voltage is undiminished by action of said write assist means.

12. A method of operating memory circuitry comprising the steps of:
    storing a bit value with a memory cell;
    providing part of data access paths to said memory cell via a plurality of bit line pairs;
    applying a boost voltage to a bit line of a bit line pair of said plurality of bit line pairs so as to increase a write voltage difference applied to said memory cell by said bit line pair for a boost portion of a write access so as to assist writing of said bit value to said memory cell;
    detecting a collision when said write access at least partially overlaps in time with a read access to said memory cell via a further bit line pair of said plurality of bit lines; and
    responding to detection of said collision by driving a write assist voltage difference applied to said memory cell by bit lines of said further bit line pair with a polarity matching said write voltage difference and a magnitude less than said write voltage difference with said boost voltage applied, driving of said further bit line pair being independent of applying said boost voltage to said bit line pair such that said boost voltage is undiminished by action of said write assist means.

13. A method as claimed in claim 12, comprising providing a VDD voltage and a ground voltage.

14. A method as claimed in claim 13, wherein said boost voltage increases said write voltage difference to greater than a voltage difference between said VDD voltage and said ground voltage.

15. A method as claimed in claim 14, wherein said boost voltage provides a voltage level to one of said bit line pair that is below said ground voltage during at least said boost portion of said write access.

16. A method as claimed in claim 13, wherein said write assist voltage difference is less than a voltage difference between said VDD voltage and said ground voltage.

17. A method as claimed in claim 12, wherein said bit value is determined by a write data signal and further comprising generating a plurality buffered signals in dependence upon said write data signal.

18. A method as claimed in claim 17, wherein said plurality buffered signals control generation of said write voltage difference without said boost voltage.

19. A method as claimed in claim 17, wherein said plurality of buffered signals drive said further bit line pair to provide said write assist voltage difference.

20. A method as claimed in claim 17, comprising generating a plurality of additional buffered signals, wherein said plurality of additional buffered signals drive said further bit line pair to provide said write assist voltage difference.

21. A method as claimed in claim 12, wherein said memory cell is part of an array of memory cells.

* * * * *